(12) United States Patent
Jang et al.

(10) Patent No.: US 9,484,157 B2
(45) Date of Patent: Nov. 1, 2016

(54) METHOD FOR PREPARING SOLID ELECTROLYTE COMPRISING POROUS THIN FILM AND DYE-SENSITIZED SOLAR CELL USING THE SAME

(75) Inventors: Yong-Jun Jang, Gyeonggi-do (KR); Sang-Hak Kim, Seoul (KR); Won-Jung Kim, Seoul (KR); Yong-Gu Kim, Gyeonggi-do (KR); Mi-Yeon Song, Seoul (KR); In-Woo Song, Busan (KR); Ji-Yong Lee, Gyeonggi-do (KR); Ki-Chun Lee, Seoul (KR)

(73) Assignee: Hyundai Motor Company, Seoul (KR)

(*) Notice: Subject to any disclaimer, the term of this patent is extended or adjusted under 35 U.S.C. 154(b) by 532 days.

(21) Appl. No.: 13/367,672

(22) Filed: Feb. 7, 2012

(65) Prior Publication Data
US 2013/0118562 A1 May 16, 2013

(30) Foreign Application Priority Data

Nov. 15, 2011 (KR) .................. 10-2011-0119188

(51) Int. Cl.
*H01G 9/20* (2006.01)
*C08J 5/18* (2006.01)
(Continued)

(52) U.S. Cl.
CPC .............. *H01G 9/2009* (2013.01); *C08J 5/18* (2013.01); *C08J 9/283* (2013.01); *C08J 2301/08* (2013.01); *C08J 2371/02* (2013.01); *H01G 9/2031* (2013.01); *H01G 9/2059* (2013.01); *H01L 51/0086* (2013.01); *H01M 2300/0082* (2013.01); *Y02E 10/542* (2013.01); *Y02P 70/521* (2015.11)

(58) Field of Classification Search
USPC .......... 264/40.1, 45.8, 48, 628, 637, 651, 86
See application file for complete search history.

(56) References Cited

U.S. PATENT DOCUMENTS

| 7,910,015 B2 | 3/2011 | Wu et al. |
| 2005/0186479 A1* | 8/2005 | Totsuka et al. ............... 429/251 |

(Continued)

FOREIGN PATENT DOCUMENTS

| CN | 1610169 A | 4/2005 |
| CN | 1431252 A | 7/2009 |

(Continued)

OTHER PUBLICATIONS

Park et al., "Dye-sensitized solar cells containing polymer film with honey-comb like morphology", Journal of Photochemistry and Photobiology A: Chemistry, vol. 203, pp. 151-154 (2009).

*Primary Examiner* — Stella Yi
(74) *Attorney, Agent, or Firm* — Mintz Levin Cohn Ferris Glovsky and Popeo, P.C.; Peter F. Corless

(57) ABSTRACT

Disclosed is a solid electrolyte for a dye-sensitized solar cell, which includes a three-dimensional porous thin film made of a hydrophilic polymer material, and a dye-sensitized solar cell using the same. More particularly, the present invention provides a high-efficient dye-sensitized solar cell, in which polymer nanofibers having high specific surface area are used in an electrolyte layer to effectively induce an increase in photocurrent, thereby increasing the amount of electrolyte impregnated. When the porous film prepared by the method of the present invention is used as a solid electrolyte for a dye-sensitized solar cell, a process of forming an electrolyte inlet and sealing the inlet is not required, which simplifies the entire process, compared to an existing dye-sensitized solar cell using a liquid electrolyte.

6 Claims, 2 Drawing Sheets

(51) Int. Cl.
*C08J 9/28* (2006.01)
*H01L 51/00* (2006.01)

(56) References Cited

U.S. PATENT DOCUMENTS

2006/0021649 A1* 2/2006 Kuroda ............... H01G 9/2031
 136/263
2006/0266411 A1 11/2006 Sugiyama et al.
2007/0289628 A1* 12/2007 Sohn et al. ................. 136/264

FOREIGN PATENT DOCUMENTS

| JP | 2007-059225 A | 3/2007 |
| JP | 2007066704 A | 3/2007 |
| JP | 2010-123462 A | 6/2010 |
| KR | 10-2005-0114607 | 12/2005 |
| KR | 10-2009-0012595 | 2/2009 |
| KR | 10-0921476 | 3/2009 |
| KR | 10-2010-0027476 | 3/2010 |

* cited by examiner

METHOD FOR PREPARING SOLID ELECTROLYTE COMPRISING POROUS THIN FILM AND DYE-SENSITIZED SOLAR CELL USING THE SAME

CROSS-REFERENCE TO RELATED APPLICATION

This application claims under 35 U.S.C. §119(a) the benefit of Korean Patent Application No. 10-2011-0119188 filed Nov. 15, 2011, the entire contents of which are incorporated herein by reference.

BACKGROUND (a) Technical Field

The present invention relates to a dye-sensitized solar cell. More particularly, it relates to a method for preparing a polymer thin film electrolyte, which is used to improve to long-term durability of a solar cell, and a dye-sensitized solar cell comprising the electrolyte prepared by the method.

(b) Background Art

Recently, as global warming becomes more of an issue, technology for using environmentally-friendly energy has attracted much attention. An attractive field, in particular, is solar cells which use new and renewable energy. Examples of such solar cells include silicon-based solar cells, thin film solar cells using inorganic substances such as copper indium gallium selenide ($Cu(InGa)Se_2$, CIGS), dye-sensitized solar cells, organic solar cells, organic-inorganic hybrid solar cells, etc. Among them, the dye-sensitized solar cells, which are inexpensive and have a commercial grade energy efficiency, have attracted attention in the field of portable electronics as well as in the field of building integrated photovoltaics (BIPV).

Unlike other solar cells, the dye-sensitized solar cell is provided with a solar cell system which absorbs visible light and produces electricity by a photoelectric conversion mechanism. Typically, the dye-sensitized solar cell uses a liquid electrolyte or a gel polymer electrolyte. This liquid electrolyte or gel polymer electrolyte may leak due to damage of a solar cell substrate, which may reduce its merchantability/cost efficiency and may further damage the health of consumers due to the toxicity of the electrolyte.

For these reasons, the development of solid electrolytes has recently been actively to pursued. Typically, the solid electrolyte completely dries a solvent on the surface of a photoelectrode ($TiO_2$) of the dye-sensitized solar cell. In this case, the current density is very low, and thus the efficiency of the solar cell cannot be expected. A technique of controlling a porous structure by electrospinning has been known, but it requires high initial investment, and the types of available polymer materials are limited.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention provides a porous polymer solid electrolyte for a dye-sensitized solar cell, which is used instead of a liquid electrolyte to prevent leakage and insufficient long-term durability, which occur in liquid dye-sensitized solar cells.

In particular, the present invention provides a solid electrolyte for a dye-sensitized solar cell, which comprises a three-dimensional porous thin film made of a hydrophilic polymer material, and a dye-sensitized solar cell using the same. More particularly, the present invention provides a high-efficient dye-sensitized solar cell, in which polymer nanofibers having high specific surface area are used in a solid electrolyte layer to effectively to induce an increase in photocurrent, thereby increasing the amount of electrolyte impregnated. That is, the present invention provides a solid electrolyte for a dye-sensitized solar cell, which comprises a three-dimensional porous thin film made of a hydrophilic polymer material to form the solid electrolyte layer, and a dye-sensitized solar cell using the same.

In one aspect, the present invention provides a method for preparing a solid electrolyte which includes a porous polymer film made of a hydrophilic polymer material More specifically, (i) a film is formed by dissolving a hydrophilic polymer in a hydrophilic solvent. Additionally, (ii) pores are formed by dissolving the formed film in another hydrophilic solvent, which does not dissolve the hydrophilic polymer of step (i), so that only the hydrophilic solvent of step (i) is dissolved.

In another aspect, the present invention provides a solid electrolyte for a dye-sensitized solar cell prepared by the method for preparing the solid electrolyte.

In still another aspect, the present invention provides a dye-sensitized solar cell comprising the solid electrolyte prepared by the method for preparing the solid electrolyte.

The above and other features of the invention are discussed infra.

BRIEF DESCRIPTION OF THE DRAWINGS

The above and other features of the present invention will now be described in detail to with reference to certain exemplary embodiments thereof illustrated the accompanying drawings which are given hereinbelow by way of illustration only, and thus are not limitative of the present invention, and wherein.

Figure 1:
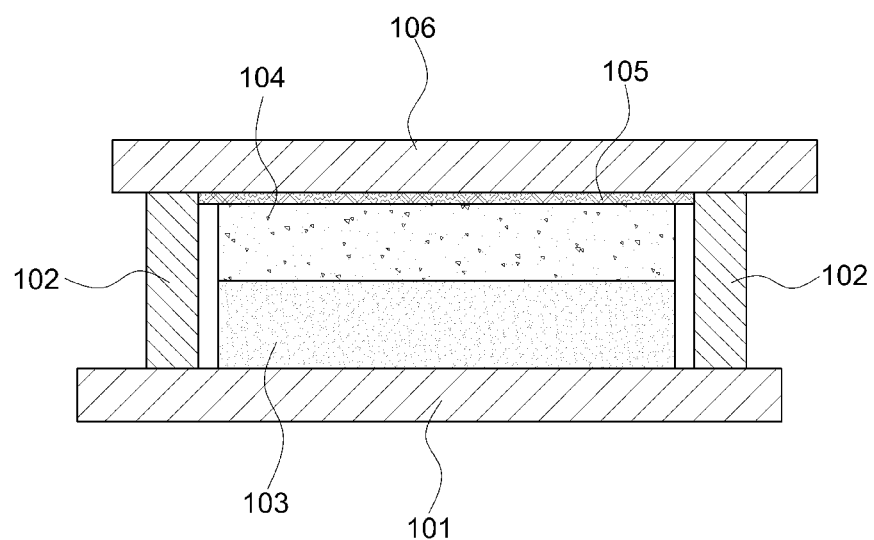
FIG. 1 is a cross-sectional view of a dye-sensitized solar cell manufactured using an electrolyte containing a porous film in accordance with an exemplary embodiment of the present invention.
Figure 2:
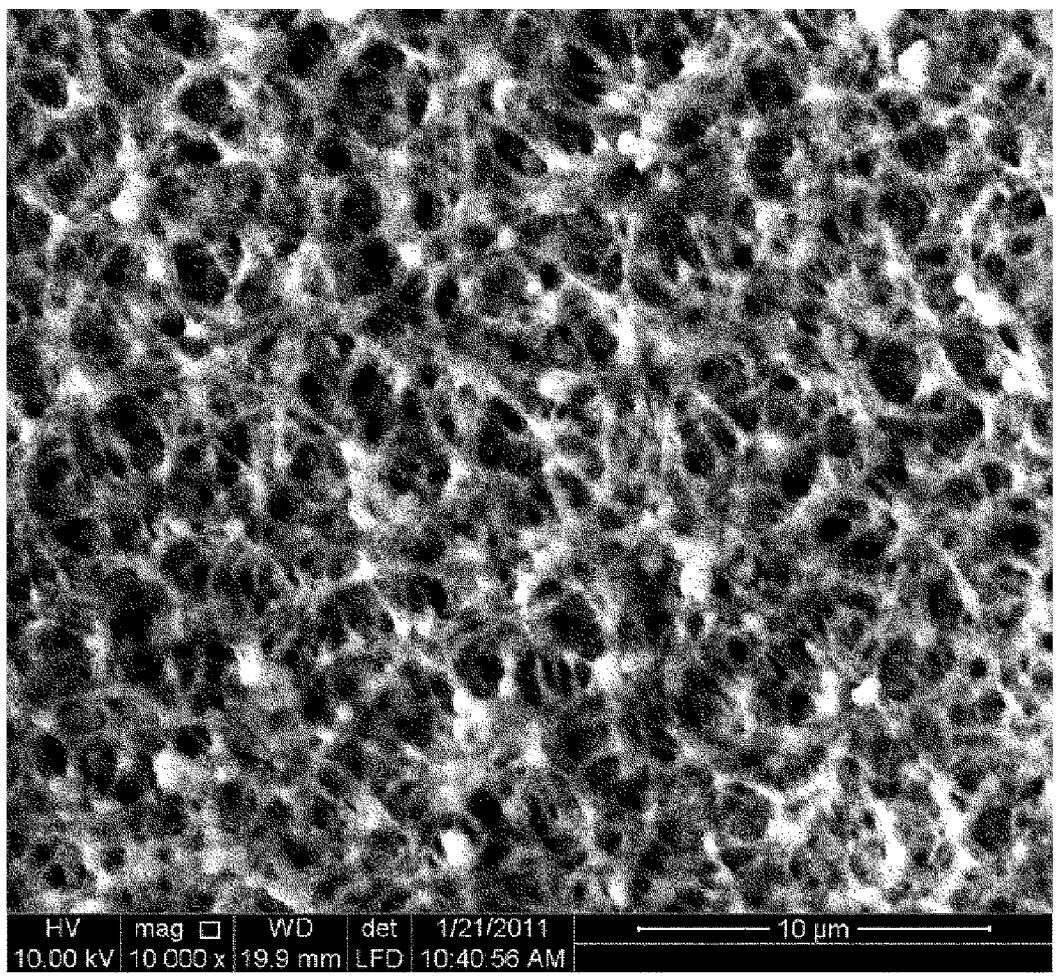
FIG. 2 shows an image of a porous structure of a solid electrolyte film in accordance with an exemplary embodiment of the present invention.

Reference numerals set forth in the Drawings includes reference to the following elements as further discussed below:

101: first substrate
102: sealing agent
103: inorganic oxide layer
104: solid electrolyte layer
105: counter electrode layer
106: second substrate It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for to example both gasoline-powered and electric-powered vehicles.

According to one aspect, the present invention provides a method for preparing a solid electrolyte comprising a porous polymer film made of a hydrophilic polymer material, the method comprising the steps of:

(i) forming a film by dissolving a hydrophilic polymer in a hydrophilic solvent; and (ii) forming pores by dissolving the formed film in another hydrophilic solvent, which does not dissolve the hydrophilic polymer of step (i), such that the hydrophilic solvent of step (i) is dissolved only.

The present invention prevents leakage and insufficient long-term durability, which occur in liquid dye-sensitized solar cells. In conventional liquid dye-sensitized solar cells, an electrolyte is dissolved in a solvent, and thus the liquid may leak through a gap in a sealing material or may flow out due to damage to a substrate, thereby reducing the durability of a device and affecting the merchantability of the device as well.

The present invention solves the above problems using a porous polymer solid electrolyte instead of a liquid electrolyte. According to the present invention, a hydrophilic polymer is dissolved in a hydrophilic solvent to form a porous thin film structure, which increases the amount of electrolyte impregnated. Then, when the hydrophilic solvent in which the hydrophilic polymer is dissolved is brought into contact with another hydrophilic solvent, the hydrophilic polymer dissolved in step (i) is not solvated with the solvent of step (ii) but instead precipitated as a solid phase, thereby inducing porosity in a polymer matrix to due to the hydrophilic interaction between the hydrophilic polymer and the existing solvent. Therefore, it is possible to easily control the porous structure and thus control the amount of electrolyte impregnated, compared to existing electrospinning techniques used in the conventional art. The hydrophilic polymer of the illustrative embodiment of the present invention has excellent adhesion to ions in the electrolyte, which results in an increase in the amount of impregnation, thereby contributing to the improvement of solar cell efficiency.

According to an exemplary embodiment of the present invention, the polymer used in the invention may preferably comprise at least one selected from the group consisting of cellulose acetate, cellulose acetate butyrate, cellulose acetate phthalate, cellulose acetate propionate, 2-hydroxyethyl cellulose, ethyl cellulose, hydroxyethyl-cellulose, hydroxypropyl cellulose, methyl cellulose, hydroxypropylmethyl cellulose, hydroxybutyl methyl cellulose, polyethylene glycol, and polypropylene glycol.

Additionally, the hydrophilic solvent used in step (i) may comprise at least one selected from the group consisting of ethanol, methanol, propanol, and distilled water. Furthermore, the hydrophilic solvent used in step (ii) may comprise acetonitrile, propionitrile, methoxypropionitrile, or glutaronitrile.

According to the exemplary embodiment of the present invention, the hydrophilic polymer may preferably be contained in an amount of 0.1 to 5 parts by relative to 100 parts by weight of the hydrophilic solvent. If the content of the hydrophilic polymer is less than to 0.1 part by weight, it is difficult to form the film, whereas, if it exceeds 5 parts by weight, it is difficult to control the thickness, thus making it difficult to manufacture the polymer electrolyte film.

Preferably, the polymer may have a weight average molecular weight of 1,000 to 20,000. If the weight average molecular weight of the polymer is less than 1,000, it is very difficult to form the film, whereas, if it exceeds 20,000, the polymer is not easily dissolved in the hydrophilic solvent.

According to an exemplary embodiment of the present invention, the film is formed using the solution, in which the hydrophilic polymer is dissolved in step (i), by a doctor blade process.

According to an exemplary embodiment of the present invention, the polymer film may have a pore size of 0.1 to 10 μm and a thickness of 1 to 50 μm.

According to another aspect, the present invention provides a solid electrolyte for a dye-sensitized solar cell prepared by the above-described method, where the dye-sensitized solar cell includes the solid electrolyte.

The dye-sensitized solar cell according to the present invention prevents leakage due to the use of a liquid electrolyte and insufficient long-term durability due to the use of a sealing agent and simplifies the manufacturing process, thereby improving the productivity.

A process of manufacturing the dye-sensitized solar cell in accordance with the exemplary embodiment of the present invention will be described below. The following examples are used for illustrating the present invention only, but not intended to limit the scope of the invention.

EXAMPLE 1

Manufacture of Porous Polymer Film

To prepare a polymer solution, 5 wt % of methyl cellulose and 95 wt % of distilled water were mixed and stirred for 24 hours. A film was formed using the prepared solution using a doctor blade. The formed film was immersed in an acetonitrile solvent such that cellulose remained as a solid film, the distilled water contained in the solution was dissolved in acetonitrile, and pores were formed at positions where the distilled water was replaced.

EXAMPLE 2

Manufacture of Cell Using Solid Electrolyte Comprising Porous Polymer Film

A titanium dioxide paste (Solaronix) for screen printing was coated on a fluorine-doped tin oxide (FTO) coated glass substrate using a screen printing device. After heating at 300° C. for 1 hour, the substrate was fired at 500° C. for 3 hours, thus forming an electrode. Dye (N3, Solaronix) was adsorbed on the formed electrode at room temperature for 24 hours. A porous film was immersed in an electrolyte (AN 50, Solaronix) for 12 hours. Then, the dried porous film was placed on the working electrode (TiO$_2$ a coating layer) adsorbing the dye and a platinum counter electrode was bonded to the electrode using Surlyn (Dupont) at 120° C.

COMPARATIVE EXAMPLE 1

Manufacture of Non-Porous Polymer Film

To prepare a polymer solution, 89.9 wt % of polypropylene glycol monoacrylate, 10 wt % of polypropylene glycol diacrylate, and 0.1 wt % of photocrosslinking initiator were mixed and stirred for 24 hours. The resulting solution was thinly coated on a glass substrate, thereby forming a film by ultraviolet irradiation (1,000 mJ).

COMPARATIVE EXAMPLE 2

Manufacture of Cell Using Solid Electrolyte Comprising Non-Porous Polymer Film A titanium dioxide paste (Solaronix) for screen printing was coated on a fluorine-doped tin oxide (FTO) coated glass substrate using a screen printing device. After heating at 300° C. for 1 hour, the substrate was fired at 500° C. for 3 hours, thus forming an electrode. Dye (N3, Solaronix) was adsorbed on the formed electrode at room temperature for 24 hours. A non-porous film was immersed in an electrolyte (AN 50, Solaronix) for 12 hours. Then, the resulting porous film was placed on the electrode (TiO$_2$ a coating layer) adsorbing the dye, and a platinum counter electrode was bonded to the electrode using Surlyn (Dupont) at 120° C.

Electrochemical properties measured from the dye-sensitized solar cells manufactured in Example 2 and Comparative Example 2 are shown in the following Table 1 including the current density (Jsc), the voltage (Voc), the fill factor (FF), and the energy conversion efficiency (%).

TABLE 1

| Samples | Current density (Jsc) | Voltage (Voc) | Fill factor (FF) | Energy conversion efficiency (%) |
|---|---|---|---|---|
| Example 2 | 18.25 | 0.770 | 50.0 | 7.140 |
| Comp. Example 2 | 0.037 | 0.613 | 22.0 | 0.005 |

It can be seen that the current density and the energy efficiency of the dye-sensitized solar cell manufactured using the porous solid electrolyte in Example 2 were improved compared to those of the dye-sensitized solar cell manufactured using the non-porous solid electrolyte in Comparative Example 2.

As described above, the present invention provides the following features and effects:

(i) When the porous film prepared by the method of the present invention is used as a solid electrolyte for a dye-sensitized solar cell, a process of forming an electrolyte inlet and sealing the inlet is not required, which simplifies the entire process, compared to an existing dye-sensitized solar cell using a liquid electrolyte. Moreover, the energy conversion efficiency of the dye-sensitized solar cell can be significantly improved, compared to an existing non-porous solid electrolyte;

(ii) The porous solid electrolyte can increase the amount of electrolyte impregnated, compared to a non-porous film, thereby obtaining high current density and photovoltaic efficiency; and (iii) The leakage of the electrolyte from the substrate can be minimized, compared to the liquid electrolyte, thereby preventing a short circuit due to contact between a counter electrode and a photoelectrode.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A method for preparing a solid electrolyte comprising a porous polymer film made of a hydrophilic polymer material, the method comprising the steps of:
   (i) forming a film by dissolving a hydrophilic polymer in a hydrophilic solvent; and
   (ii) forming pores by dissolving the formed film in another hydrophilic solvent, which does not dissolve the hydrophilic polymer of step (i), such that only the hydrophilic solvent of step (i) is dissolved,
   wherein the hydrophilic solvent used in step (i) comprises at least one selected from the group consisting of ethanol, methanol, propanol, and distilled water,
   wherein step (i) comprises a doctor blade process for the solution in which the hydrophilic polymer is dissolved in step (i), and
   wherein the hydrophilic polymer used in step (i) is contained in an amount of 0.1 to 5 parts by weight relative to 100 parts by weight of the hydrophilic solvent.

2. The method of claim 1, wherein the polymer comprises at least one selected from the group consisting of cellulose acetate, cellulose acetate butyrate, cellulose acetate phthalate, cellulose acetate propionate, 2-hydroxyethyl cellulose, ethyl cellulose, hydroxyethyl-cellulose, hydroxypropyl cellulose, methyl cellulose, hydroxypropylmethyl cellulose, hydroxybutyl methyl cellulose, polyethylene glycol, and polypropylene glycol.

3. The method of claim 1, wherein the hydrophilic solvent used in step (ii) comprises acetonitrile, propionitrile, methoxypropionitrile, or glutaronitrile.

4. The method of claim 1, wherein the hydrophilic polymer has a weight average molecular weight of 1,000 to 20,000.

5. The method of claim 1, wherein the porous polymer film has a pore size of 0.1 to 10 μm.

6. The method of claim 1, wherein the porous polymer film has a thickness of 1 to 50 μm.

* * * * *